United States Patent [19]

Tanzilli et al.

[11] Patent Number: 5,427,629
[45] Date of Patent: Jun. 27, 1995

[54] COVERPLATE FOR SILICON SOLAR CELLS

[75] Inventors: Richard A. Tanzilli; Joseph J. Gebhardt, both of Malvern, Pa.

[73] Assignee: The United States of America as represented by the Secretary of the Air Force, Washington, D.C.

[21] Appl. No.: 520,109

[22] Filed: Jul. 11, 1983

[51] Int. Cl.⁶ .......................................... H01L 23/552
[52] U.S. Cl. .................................... 136/251; 136/206; 136/259; 136/292
[58] Field of Search ............... 136/206, 251, 259, 261, 136/292

[56] References Cited

U.S. PATENT DOCUMENTS

| | | | |
|---|---|---|---|
| 3,091,555 | 5/1963 | Smythe | 117/201 |
| 3,533,850 | 10/1970 | Tarneja et al. | 136/89 |
| 3,539,883 | 11/1970 | Harrison | 317/234 |
| 3,922,774 | 12/1975 | Lindmayer et al. | 29/572 |
| 3,949,463 | 4/1976 | Lindmayer et al. | 29/572 |
| 4,086,102 | 4/1978 | King | 136/89 CC |
| 5,360,491 | 11/1994 | Carey et al. | 136/256 |

Primary Examiner—Donald P. Walsh
Assistant Examiner—Chrisman D. Carroll
Attorney, Agent, or Firm—Charles E. Bricker; Thomas L. Kundert

[57] ABSTRACT

A silicon solar cell having a coverplate made of $\beta$-silicon carbide.

5 Claims, 3 Drawing Sheets

COVERPLATE FOR SILICON SOLAR CELLS

RIGHTS OF THE GOVERNMENT

The invention described herein may be manufactured and used by or for the Government of the United States for all governmental purposes without the payment of any royalty.

BACKGROUND OF THE INVENTION

This invention relates to solar cells, particularly to a silicon carbide coverplate for a silicon solar cell.

The use of photovoltaic devices, commonly known as solar cells, to convert light energy to electrical energy is well known. The efficiency of a solar cell is directly related to the amount of useful light which is absorbed by the solar cell. Only a portion of the light striking the top surface of a solar cell is useful to the cell. Another portion of the light striking the cell is nonuseful, i.e., the light has wavelengths outside the range useful to the cell; and yet another portion of light is reflected by the solar cell. To reduce the problem of light reflection, solar cells employ an antireflective coating positioned on the surface of the solar cell through which light enters.

The antireflection coating improves the absorption of light in the useful wavelength range by reducing reflection of such light. The coating also absorbs and reradiates or reflects light in the nonuseful wavelength range.

In space applications, where reliability in a hostile environment and over extended time periods is required, a cover slide, generally quartz, is placed over the antireflective coating to shield the solar cell from harmful radiation. The use of quartz has, however, created problems since quartz will strongly absorb high intensity radiation in the 9 to 11 micron range, causing degradation in the solar cell.

Accordingly, it is an object of the present invention to provide a replacement for the quartz cover slide used heretofore in solar cells.

Other objects and advantages of the invention will become apparent upon consideration of the following detailed description.

SUMMARY OF THE INVENTION

In accordance with the present invention there is provided a silicon solar cell having a $\beta$-silicon carbide coverplate. In one aspect the $\beta$-SiC coverplate has a single layer of $CeF_3$ antireflective coating applied to both surfaces. In another aspect the $\beta$-SiC coverplate has a two-layer antireflective coating consisting of SiO and $MgF_2$ applied to both surfaces.

DETAILED DESCRIPTION OF THE DRAWING

Figure 1:
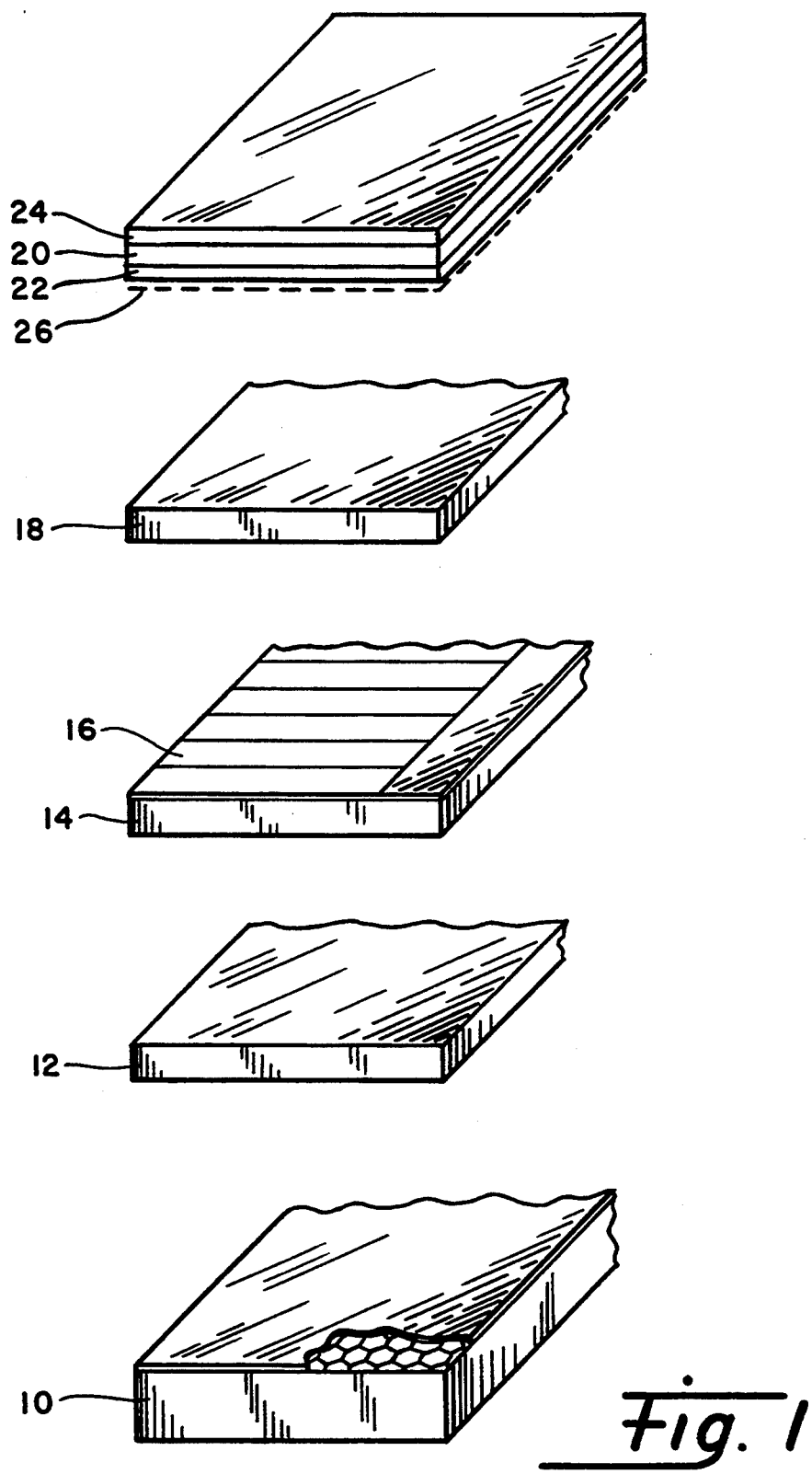
FIG. 1 is an exploded representation of a silicon solar cell which incorporates the present invention.

Reference is now made to FIG. 1 of the drawing which illustrates in exploded form, a 2×2 cm silicon solar cell utilizing the protective window material of this invention. As shown therein, the solar cell comprises a conventional support structure 10, such as an aluminum honeycomb body, a conventional adhesive 12 for mounting a cell body 14 consisting essentially of silicon with minute amounts of dopant materials, such as arsenic, boron, gallium or phosphorus to form a PN junction near the surface of the silicon, not shown. A conventional antireflecting coating 16 is applied to the planar surface of the cell body 14. A conventional adhesive 18 is applied to the coating 16 for applying the $\beta$-SiC coverplate 20 of this invention to the silicon cell body 14. Antireflective coatings 22 and 24 are applied to both surfaces of the coverplate 20 to recover reflection losses from both surfaces. A conventional UV filter, represented by broken line 26 may be applied to the rear surface of coverplate 20, although such a filter does not appear to be needed since the coverplate appears to reflect energy below about 0.4 microns.

The $\beta$-SiC coverplate 20 may be prepared by chemical vapor deposition and subsequently ground and polished in accordance with conventional techniques to a desired thickness as defined by the solar cell's working environment. Silicon carbide is a relatively inert, refractory material with a low coefficient of thermal expansion. It occurs in two crystalline forms, $\alpha$ and $\beta$. The $\beta$ form is face-centered cubic and the $\alpha$ form is hexagonal. The $\beta$ form is converted to the $\alpha$ form by heating to about 2100° C. The $\beta$-SiC may be formed from the gas phase by reducing alkylchlorosilanes with hydrogen at 1100°–1400° C. to obtain coherent, dense deposits.

Figure 2:
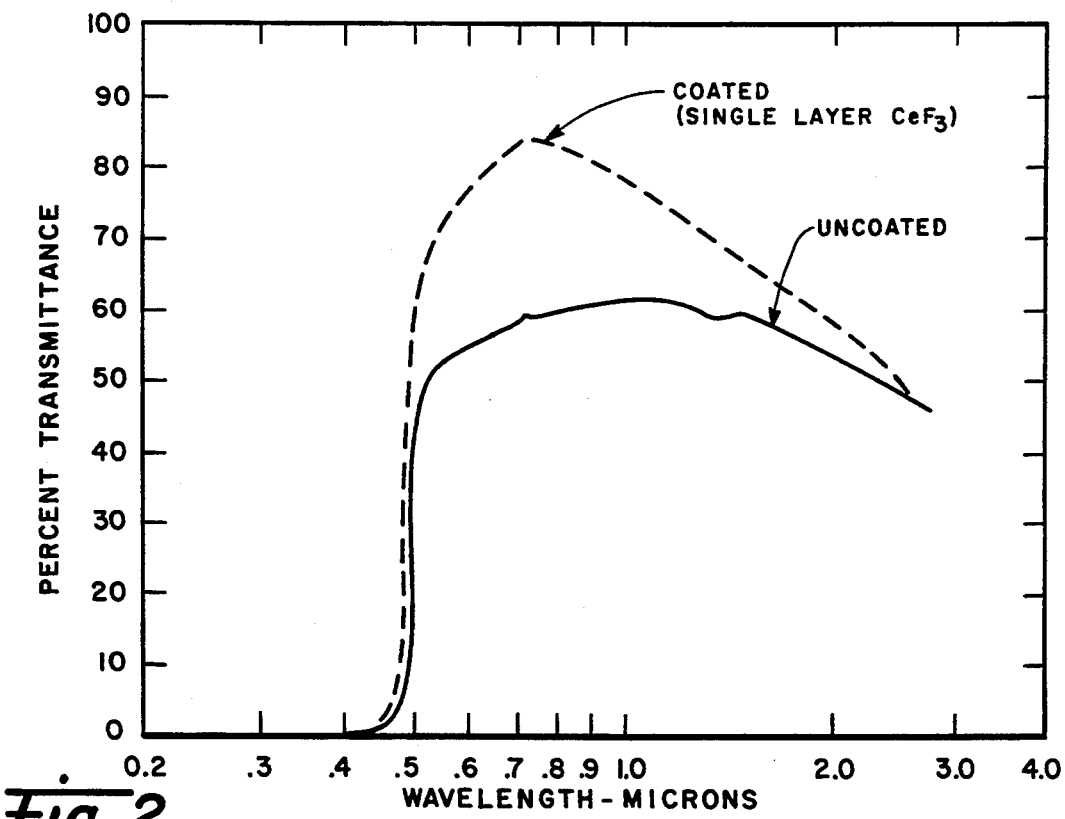
FIG. 2 illustrates the hemispherical transmittance of a $\beta$-SiC coverplate before and after applying the single layer $CeF_3$ antireflective coating.
Figure 3:
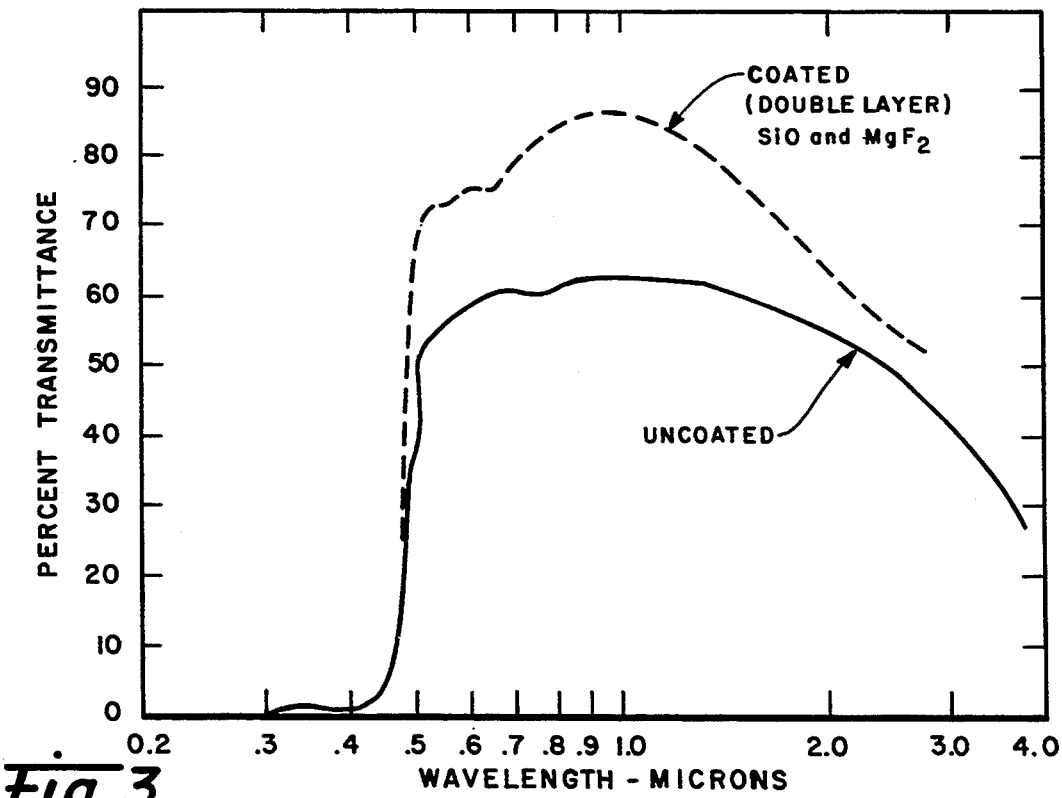
FIG. 3 illustrates the hemispherical transmittance of a $\beta$-SiC coverplate before and after applying the double layer $SiO/MgF_2$ antireflective coating.
Figure 4:
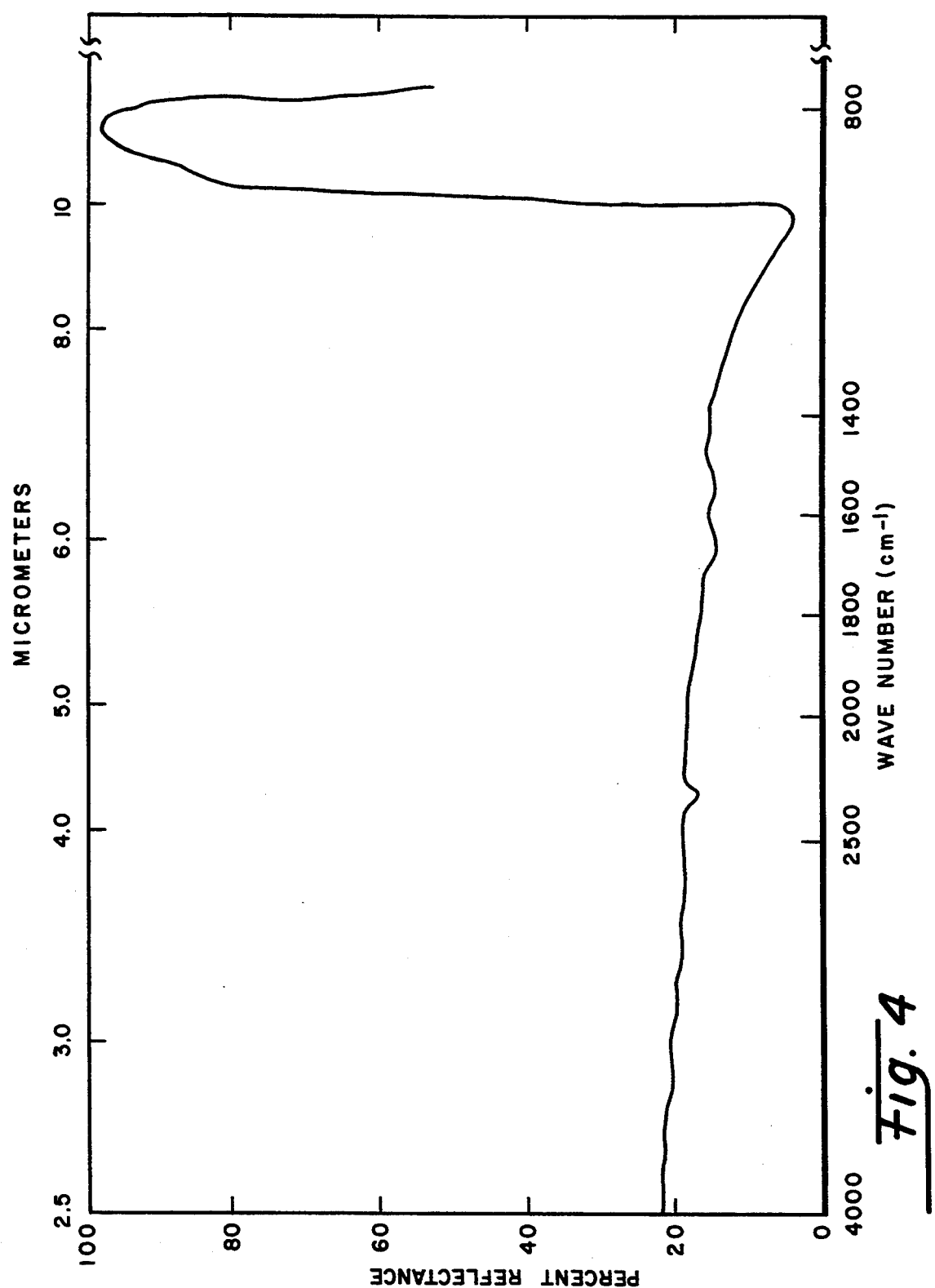
FIG. 4 illustrates the specular reflectance of a $\beta$-Sic coverplate having a single layer $CeF_3$ antireflective coating thereon.

The antireflective coatings 22 and 24 may be vacuum evaporated and deposited onto the coverplate 20, or otherwise applied in accordance with procedures known in the art. The single layer of $CeF_3$ was designed to give a transmittance maximum at 0.65 microns. The two-layer antireflective coating consisted of a quarter-wave film of SiO(n=1.85) and a second layer of $MgF_2$ (n=1.35), also designed for 0.65 microns. FIG. 2 illustrates transmittance data for a 0.0125-inch thick $\beta$-SiC coverplate without and with a single layer $CeF_3$ antireflective coating applied to both surfaces. FIG. 3 illustrates transmittance data for a 0.0065-inch thick $\beta$-SiC coverplate without and with the above-described two-layer antireflective coating applied to both sides. FIG. 4 illustrates specular reflectance data for the coverplate described in connection with FIG. 2.

The $\beta$-silicon carbide coverplate of the present invention provides an effective mechanism for protecting silicon solar cells from the degradative effects induced by high intensity thermal radiation conditions, particularly those encountered within the operational environment of silicon solar cell-equipped satellites. It protects the cell against undesirable radiation in the range of about 10–12 microns of the EM spectrum, while simultaneously providing a protective visible window in the 0.5 to 1.5 micron region.

Various modifications may be made in the present invention without departing from the spirit thereof or the scope of the appended claims.

We claim:

1. A silicon solar cell comprising a support structure, a silicon cell body consisting essentially of silicon and minor amounts of dopant materials added thereto to form a photovoltaic junction near one surface of said cell body, and a ceramic coverplate affixed to said one surface of said cell body, wherein said coverplate is β-silicon carbide.

2. The cell of claim 1 wherein said cell body is adhesively affixed to said support structure and said ceramic coverplate is adhesively affixed to said one surface of said cell body.

3. The cell of claim 2 wherein said coverplate has a single cerium fluoride antireflective coating affixed to each side thereof.

4. The cell of claim 2 wherein an ultraviolet filter is positioned between said coverplate and said one surface of said cell body.

5. The cell of claim 2 wherein said coverplate has an antireflective coating consisting of a first layer of SiO and a second layer of $MgF_2$ affixed to each side thereof.

* * * * *